(12) United States Patent
Huang

(10) Patent No.: US 7,916,495 B2
(45) Date of Patent: Mar. 29, 2011

(54) UNIVERSAL SOLDER PAD

(75) Inventor: Chun-Line Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 454 days.

(21) Appl. No.: 12/049,493

(22) Filed: Mar. 17, 2008

(65) Prior Publication Data

US 2008/0316724 A1    Dec. 25, 2008

(30) Foreign Application Priority Data

Jun. 22, 2007   (TW) .............................. 96122647 A

(51) Int. Cl.
*H05K 7/10* (2006.01)
(52) U.S. Cl. ......... 361/767; 361/763; 361/766; 361/768
(58) Field of Classification Search .................. 174/260, 174/263, 557, 558; 361/760, 763, 766, 767, 361/768, 782, 808
See application file for complete search history.

(56) References Cited

U.S. PATENT DOCUMENTS

| 5,303,122 | A | * | 4/1994 | Adams et al. ................. 361/767 |
| 5,683,788 | A | * | 11/1997 | Dugan et al. .................. 428/209 |
| 6,115,262 | A | * | 9/2000 | Brunner et al. ............... 361/774 |
| 7,084,353 | B1 | * | 8/2006 | Downes ........................ 174/261 |

* cited by examiner

*Primary Examiner* — Dameon E Levi
*Assistant Examiner* — Hoa C Nguyen
(74) *Attorney, Agent, or Firm* — Kirton & McConkie; Evan R. Witt

(57) ABSTRACT

A universal solder pad is used with a plurality of SMD components having different sizes. Each SMD component includes a first conductive part and a second conductive part. The universal solder pad includes a first pad unit and a second pad unit. The first and second pad units are electrically connected to the first and second conductive parts of the SMD component, respectively. Each of the first and second pad units includes a main portion and a first extension portion. The first extension portion is extended from a first sidewall of the main portion and includes a first border, a second border and a third border. The second border and the third border of the first extension portion are parallel with each other for facilitating alignment of the first and second conductive parts of the SMD component with respect to the first pad unit and the second pad unit.

18 Claims, 12 Drawing Sheets

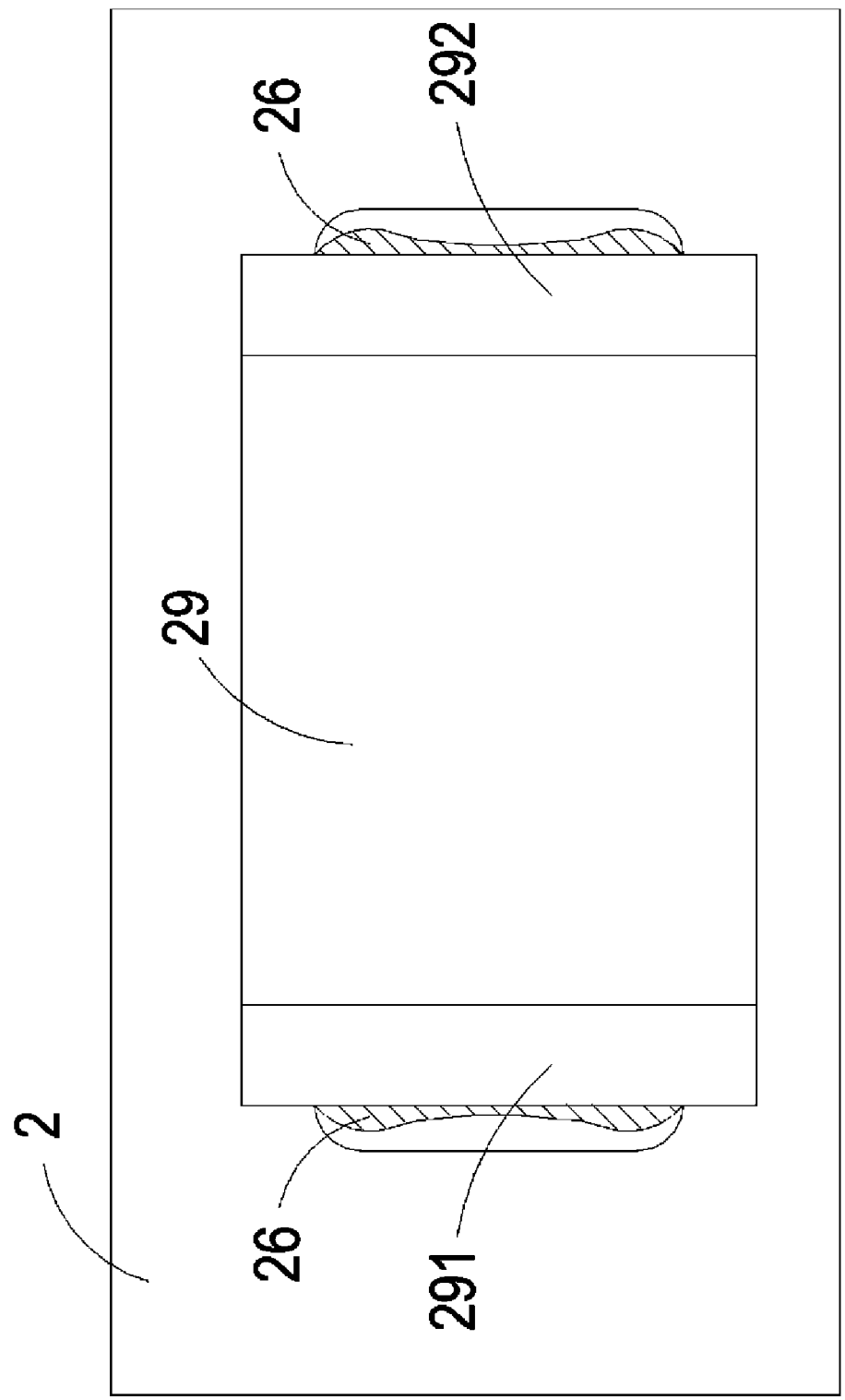

UNIVERSAL SOLDER PAD

FIELD OF THE INVENTION

The present invention relates to a solder pad, and more particularly to a universal solder pad for use with different-sized SMD components.

BACKGROUND OF THE INVENTION

Conventionally, a pin-through-hole technology (PTHT) is employed to mount electronic components onto one side of a printed circuit board through pin-through-hole connections. Since a plurality of through holes corresponding to the pins of the electronic components are drilled in the printed circuit board and the solder joints between the electronic components and the electronic components are very large, the pin-through-hole technology may be applied to the relatively low-density integrated circuits.

With increasing progress of fabricating integrated circuits, the semiconductor packages are developed toward minimization and high integration. As a consequence, the requirement of increasing the pin density of the semiconductor packages becomes more important. Recently, a surface mount technology (SMT) is gradually used to constructing relatively high-density integrated circuits. The printed circuit board usually has flat solder pads without holes. Generally, the process of performing the surface mount technology (SMT) principally comprises the following steps. First of all, solder paste is applied to all the solder pads. Then, the surface-mounted devices (SMDs) are precisely placed on the solder pads. The SMDs and the printed circuit board are then heated in a reflow soldering oven in order to minimize thermal stresses when the assemblies cool down after soldering. The printed circuit board then enters a zone where the temperature is high enough to melt the solder paste, thereby bonding the SMDs' pins on the printed circuit board.

Since the SMD components may be mounted on both sides of the printed circuit board, the space utilization of the printed circuit board is increased. In addition, the SMD components are usually made physically small and lightweight, thereby allowing much higher circuit densities. Surface mounting lends itself well to a high degree of automation, so that the fabricating cost is reduced.

Due to the very small size and spacing of the SMD components, there are also some drawbacks. For example, the alignment of the SMD components with the corresponding solder pads on the printed circuit board may usually be oblique or shifted if the profiles of the solder pads are improper or the solder paste is not evenly applied. In addition, a solder paste, which exhibits excessive out-gassing during the initial stages of the melting of the solder powder, will also result in tombstone defects. In a case that the SMD components fail to be well bonded on the corresponding solder pads, the electrical properties of the integrated circuit are deteriorated.

FIG. 1A is a schematic cross-sectional view illustrating a SMD component bonded on conventional solder pads. FIG. 1B is a top view of the resulting structure of FIG. 1A. As shown in FIGS. 1A and 1B, the solder pad 12 has a substantially rectangular profile and arranged on a surface of a circuit board 11. A surface-mounted device (SMD) component 10, for example a passive component such as a stack capacitor, has a first conductive part 101 and a second conductive part 102. The SMD component 10 is bonded on the solder pads 12 via solder paste 13. Generally, the width of the solder pad 12 is greater than the width of the SMD component 10. Ideally, the length direction of the SMD component 10 is consistent with a straight line passing through the centers of the two solder pads 12. Since no marks or retaining elements are arranged on the solder pads 12, the alignment of the first conductive part 101 and the second conductive part 102 of the SMD component 10 with respect to the solder pads 12 is usually unsatisfied. For example, the length direction of the SMD component 10 is deviated from the ideal line, as is indicated in the dashed region. Under this circumstance, the electrical properties of the integrated circuit will be deteriorated and the circuit board 11 is not aesthetically pleasing.

As known, during the solder paste 13 is liquefied and then cooled, the solder paste 13 exerts small amounts of torque on each side of the SMD component 10 through surface tension and cohesion. If the solder paste 13 is not evenly applied, the differences in cohesion cause more torque on one side that pulls the opposite side up and off the solder pad 12, as can be seen in FIG. 2. Therefore, a tombstone defect is resulted and the SMD component 10 is no longer electrically connected to the circuit board 11.

Since electronic products become more diverse, the electronic components used in these electronic products have a variety of specifications. In other words, the specifications of the solder pads are varied depending on the kinds of the corresponding SMD components. Therefore, the solder pads are not cost-effective.

In views of the above-described disadvantages resulted from the conventional method, the applicant keeps on carving unflaggingly to develop a universal solder pad according to the present invention through wholehearted experience and research

SUMMARY OF THE INVENTION

It is an object of the present invention to provide a universal solder pad for use with different-sized SMD components so as to enhance cost effectiveness.

Another object of the present invention provide a universal solder pad for minimizing the undesired effects such as oblique alignment, deviation and/or tombstone defects.

In accordance with an aspect of the present invention, there is provided a universal solder pad of a circuit carrier for use with a plurality of SMD components having different sizes. Each of the SMD components includes a first conductive part and a second conductive part. The universal solder pad includes a first pad unit and a second pad unit. The first pad unit is electrically connected to the first conductive part of the SMD component. The second pad unit is electrically connected to the second conductive part of the SMD component. Each of the first pad unit and the second pad unit includes a main portion and a first extension portion. The first extension portion is extended from a first sidewall of the main portion and includes a first border, a second border and a third border. The second border and the third border of the first extension portion are parallel with each other for facilitating alignment of the first and second conductive parts of the SMD component with respect to the first pad unit and the second pad unit.

In accordance with another aspect of the present invention, there is provided a solder pad of a circuit carrier for use with a SMD component. The SMD component includes a first conductive part and a second conductive part. Each of the first pad unit and the second pad unit includes a main portion and a first extension portion. The first extension portion is extended from a first sidewall of the main portion and includes a first border, a second border and a third border. The second border and the third border of the first extension portion are parallel with each other for facilitating alignment of the first and second conductive parts of the SMD component with respect to the first pad unit and the second pad unit.

The above contents of the present invention will become more readily apparent to those ordinarily skilled in the art after reviewing the following detailed description and accompanying drawings, in which:

BRIEF DESCRIPTION OF THE DRAWINGS

FIG. 8C is a schematic cross-sectional view illustrating a third SMD component mounted on the universal solder pad according to the second embodiment of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
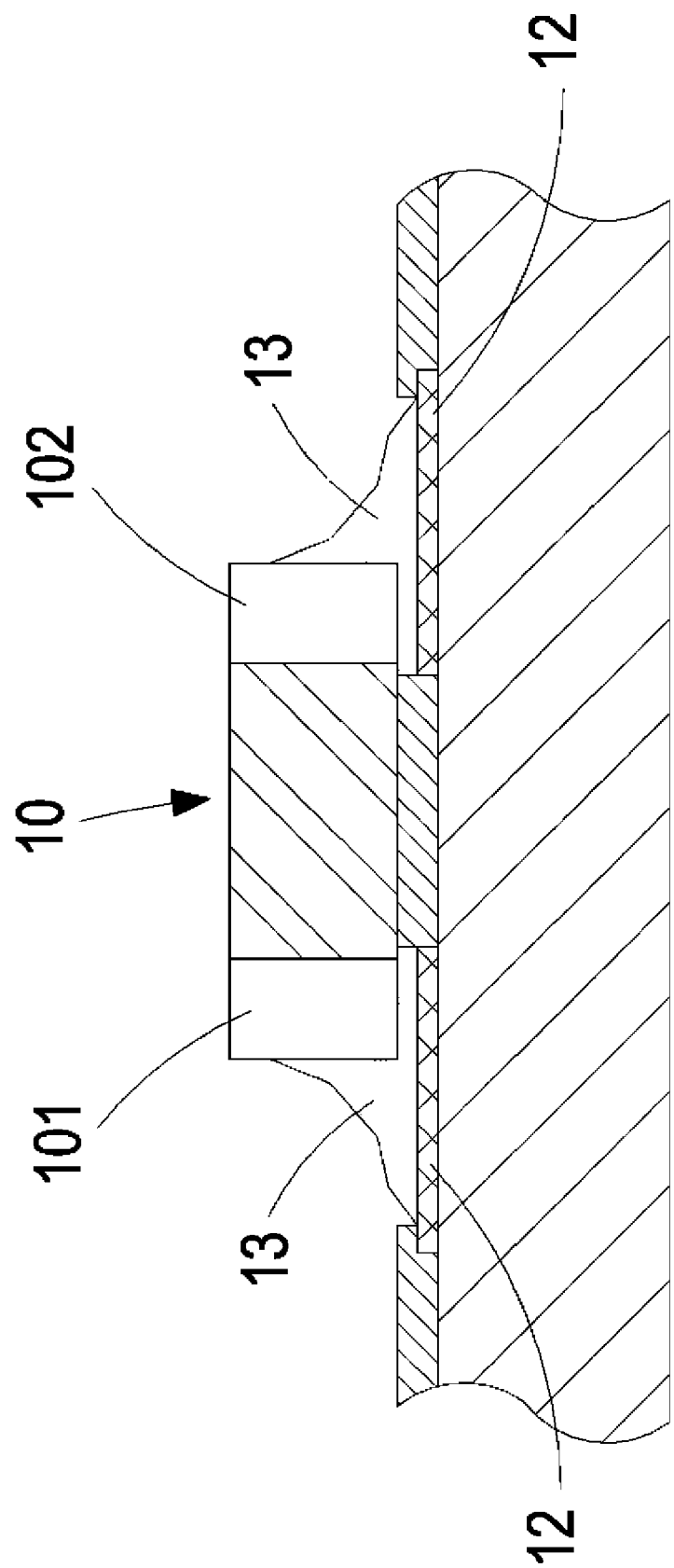
FIG. 1A is a schematic cross-sectional view illustrating a SMD component bonded on conventional solder pads.
Figure 1B:
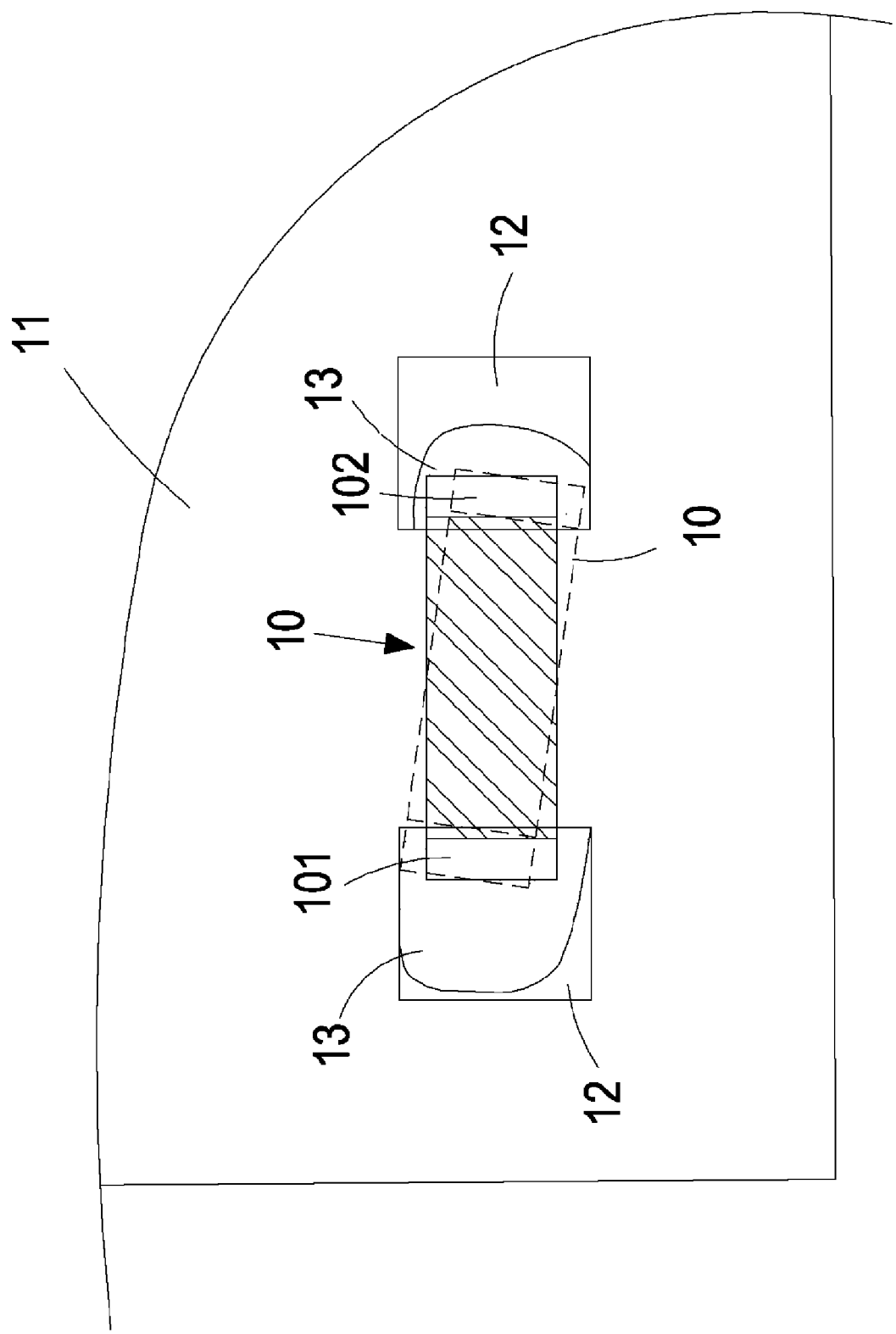
FIG. 1B is a top view of the resulting structure of FIG. 1A.
Figure 2:
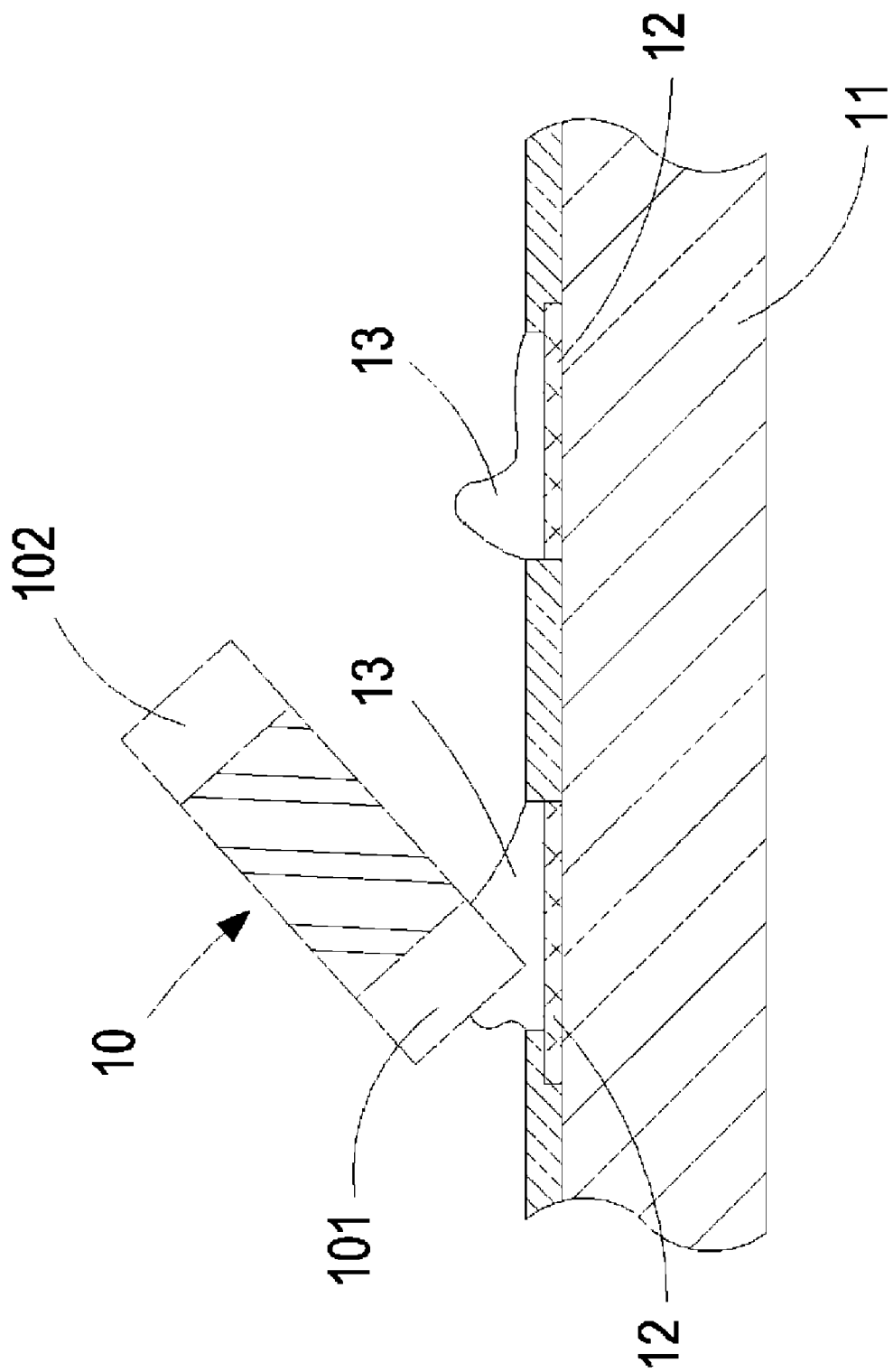
FIG. 2 is a schematic view illustrating a tombstone defect of using the conventional solder pads.
Figure 3:
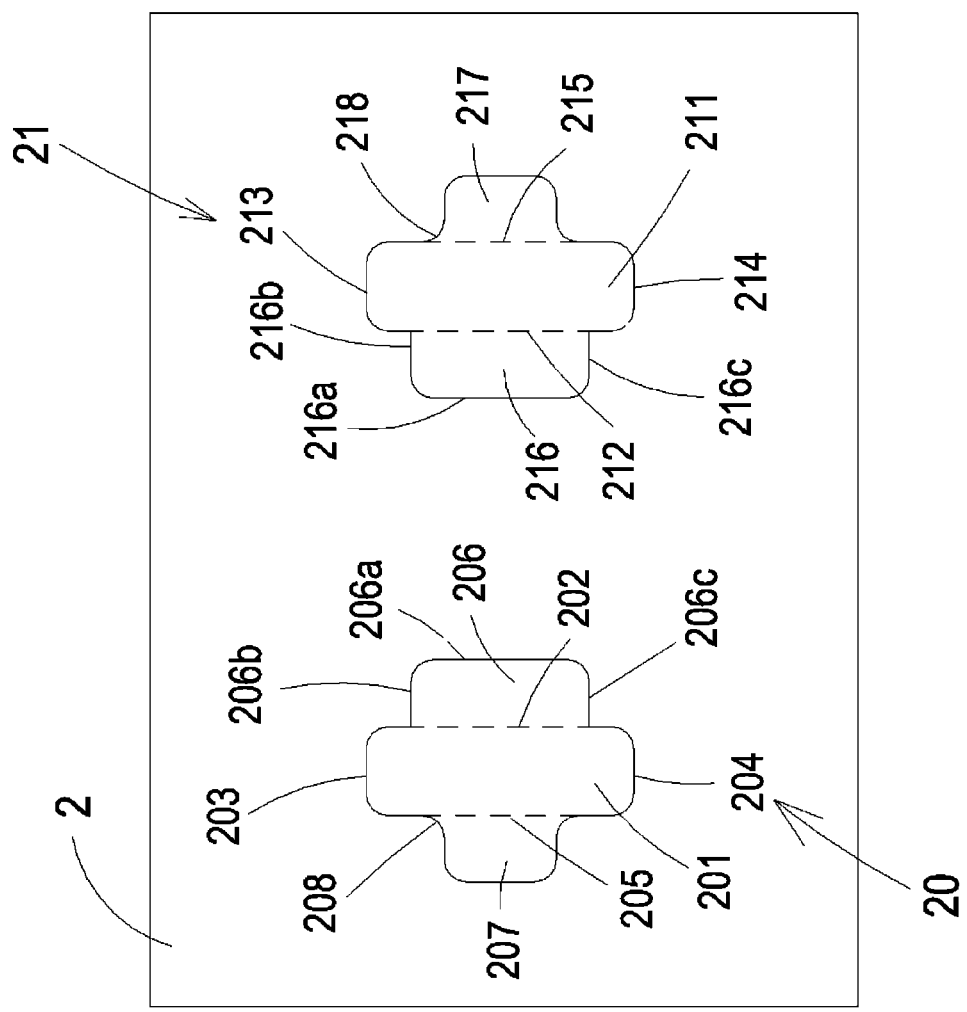
FIG. 3 is a schematic view illustrating a universal solder pad according to a first embodiment of the present invention.

Referring to FIG. 3, a schematic view of a universal solder pad according to a first preferred embodiment of the present invention is illustrated. The universal solder pad is arranged on a surface of a circuit carrier 2. An example of the circuit carrier 2 includes but is not limited to a printed circuit board, a printed wiring board or a substrate. The universal solder pad of the present invention is applicable to many kinds of SMD components having different size specifications. After the conductive parts of a SMD component (not shown) is bonded on the universal solder pad, the SMD component is electrically connected to the circuit carrier 2.

As shown in FIG. 3, the universal solder pad principally includes a first pad unit 20 and a second pad unit 21. The first pad unit 20 includes a main portion 201, which has a first sidewall 202, a second sidewall 203, a third sidewall 204 and a fifth sidewall 205. The second pad unit 21 includes a main portion 211, which has a first sidewall 212, a second sidewall 213, a third sidewall 214 and a fifth sidewall 215. The first sidewall 202 of the first pad unit 20 is disposed beside the first sidewall 212 of the second pad unit 21. A first extension portion 206 is extended from the middle of the first sidewall 202 of the main portion 201. Likewise, a first extension portion 216 is extended from the middle of the first sidewall 212 of the main portion 211. The first extension portions 206 and 216 are symmetrical with each other.

In some embodiments, the first extension portion 206 of the first pad unit 20 includes a first border 206a, a second border 206b and a third border 206c. Likewise, the first extension portion 216 of the second pad unit 21 includes a first border 216a, a second border 216b and a third border 216c. The first borders 206a and 216a face to each other. Especially, since the second border 206b is parallel with the third border 206c and the second border 216b is parallel with the third border 216c, the second borders 206b, 216b and the third borders 206c, 216c may function as retaining marks for facilitating alignment of the conductive parts of the SMD component (not shown) with respect to the first pad unit 20 and the second pad unit 21. As a consequence, the possibility of causing the oblique alignment is reduced. In addition, after solder paste (not shown) is applied on the main portions 201, 211 and the first extension portions 206, 216 and the corresponding conductive parts of the SMD component are placed on the first pad unit 20 and the second pad unit 21, the second borders 206b, 216b and the third borders 206c, 216c may hinder the solder paste from overflowing outside the first pad unit 20 and the second pad unit 21.

For further reducing the oblique alignment and thus the tombstone defects, the first pad unit 20 and the second pad unit 21 may optionally include confining portions 207 and 217, respectively. In this embodiment, the confining portions 207 and 217 are substantially second extension portions of the first pad unit 20 and the second pad unit 21. The second extension portion (i.e. confining portion) 207 is extended from the middle of the fourth sidewall 205 of the main portion 201. Likewise, the second extension portion (i.e. confining portion) 217 is extended from the middle of the fourth sidewall 215 of the main portion 211. In this embodiment, the length of the confining portion 207 (217) is smaller than that of the first extension portion 206 (216). More especially, two turning portions 208 are formed between the corners of the confining portion 207 and the main portion 201, and two turning portions 218 are formed between the corners of the confining portion 217 and the main portion 211. The turning portions 208 and 218 may hinder the solder paste from overflowing outside the first pad unit 20 and the second pad unit 21.

In some embodiments, the length, the width and the area of the confining portion 207 (217) are smaller than those of the main portion 201 (211). In a case that the conductive parts of a SMD component are mounted on the main portions 201, 211 and partially the confining portions 207, 217, the borders of the confining portion 207 and 217 may be naturally formed as a retaining wall for hindering the solder paste from overflowing outside the first pad unit 20 and the second pad unit 21 because the areas of the confining portions 207, 217 are smaller than the main portions 201, 211.

Figure 4:
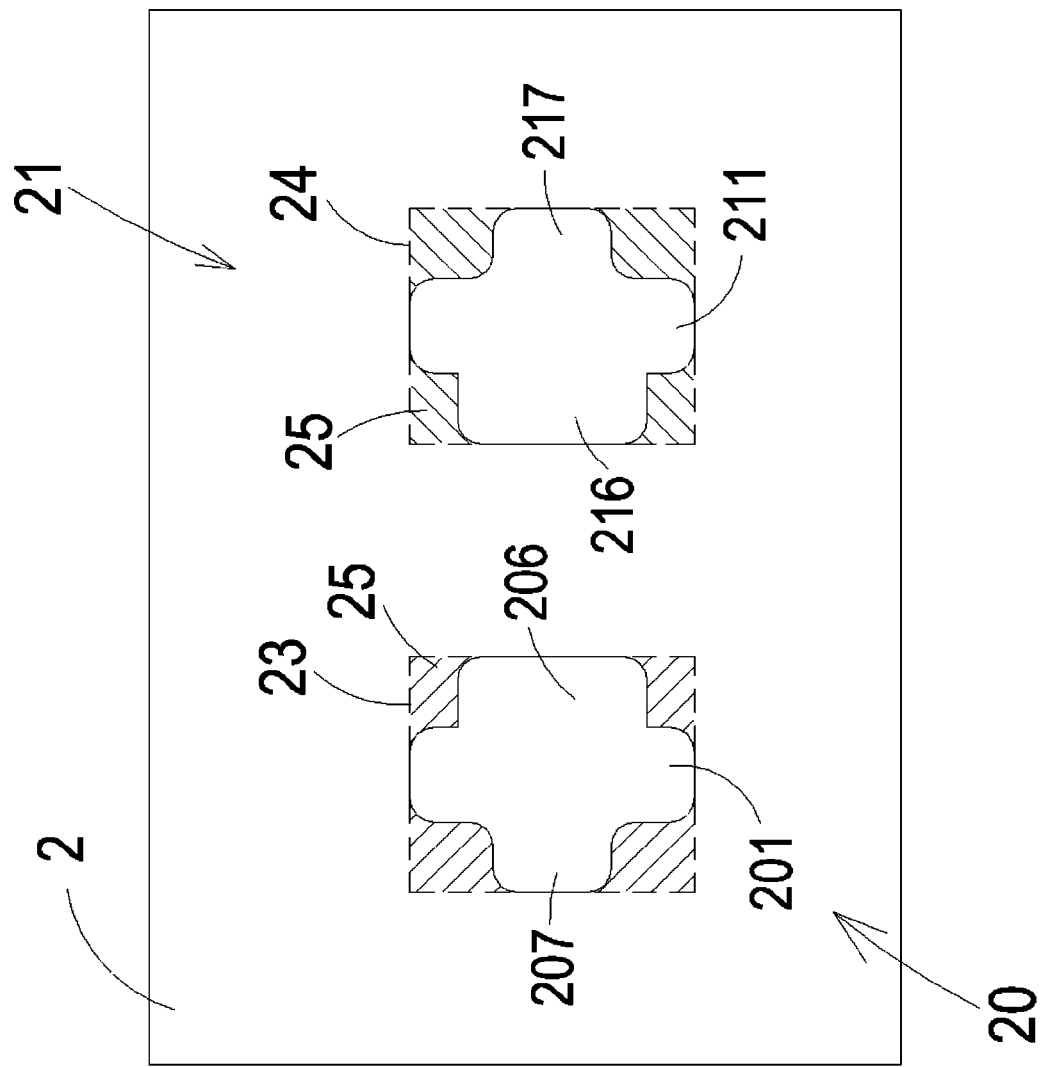
FIG. 4 is a schematic view illustrating a variant of the universal solder pad in FIG. 3.

The profiles of the universal solder pad in FIG. 3 may be formed on the circuit carrier 2 by etching. It is noted that, however, those skilled in the art will readily observe that numerous modifications and alterations of may be made to fabricate the universal solder pad. For example, as shown in FIG. 4, two rectangular solderable regions 23 and 24 are firstly formed on the circuit carrier 2, and then non-solderable primer 25 is applied on four corners of the rectangular solderable regions 23 and 24 to define the first pad unit 20 and the second pad unit 21.

The universal solder pad of the present invention may be used with different-sized SMD components. Hereinafter, a first SMD component (e.g. a 0603 stack capacitor having a dimension of 0.063"×0.031") and a second SMD component (e.g. a 0805 stack capacitor having a dimension of 0.08"×0.05") are illustrated for example with reference to FIG. 5.

Figure 5A:
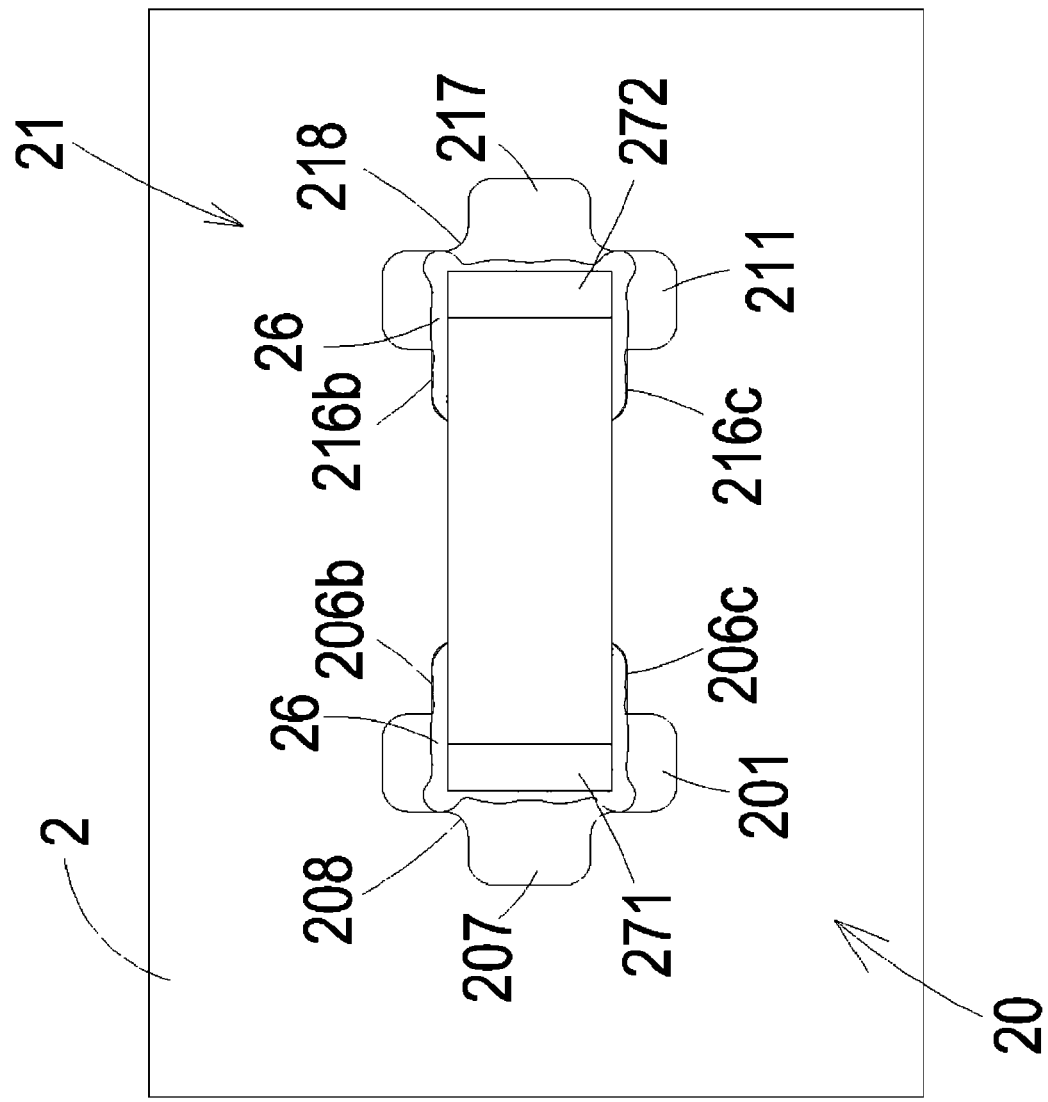
FIG. 5A is a schematic cross-sectional view illustrating a first SMD component mounted on the universal solder pad according to the first embodiment of the present invention.

Please refer to FIG. 5A, which is a schematic cross-sectional view illustrating the first SMD component mounted on the universal solder pad according to the first embodiment of the present invention. As shown in FIG. 5A, the first conductive part 271 and the second conductive part 272 of the first SMD component 27 are attached on the first pad unit 20 and the second pad unit 21 via the solder paste 26. Since the width of the conductive part 271 (272) is smaller than the first border 206a (216a) of the first extension portion 206 (216) and the second border 206b (216b) is parallel with the third border 206c (216c), the second borders 206b 216b and the third borders 206c, 216c may function as retaining marks for facilitating alignment of the first conductive part 271 and the second conductive part 272 of the first SMD component 27 with respect to the first pad unit 20 and the second pad unit 21. As a consequence, the possibility of causing the oblique alignment is reduced. In addition, the second borders 206a, 216a and the third borders 206c, 216c may hinder the solder paste 26 from overflowing outside the first pad unit 20 and the second pad unit 21. Similarly, the turning portions 208 and 218 may also function as retaining walls for hindering the solder paste from overflowing outside the first pad unit 20 and the second pad unit 21. By means of the universal solder pad of the present invention, the oblique alignment and the tombstone defects are minimized.

Figure 5B:
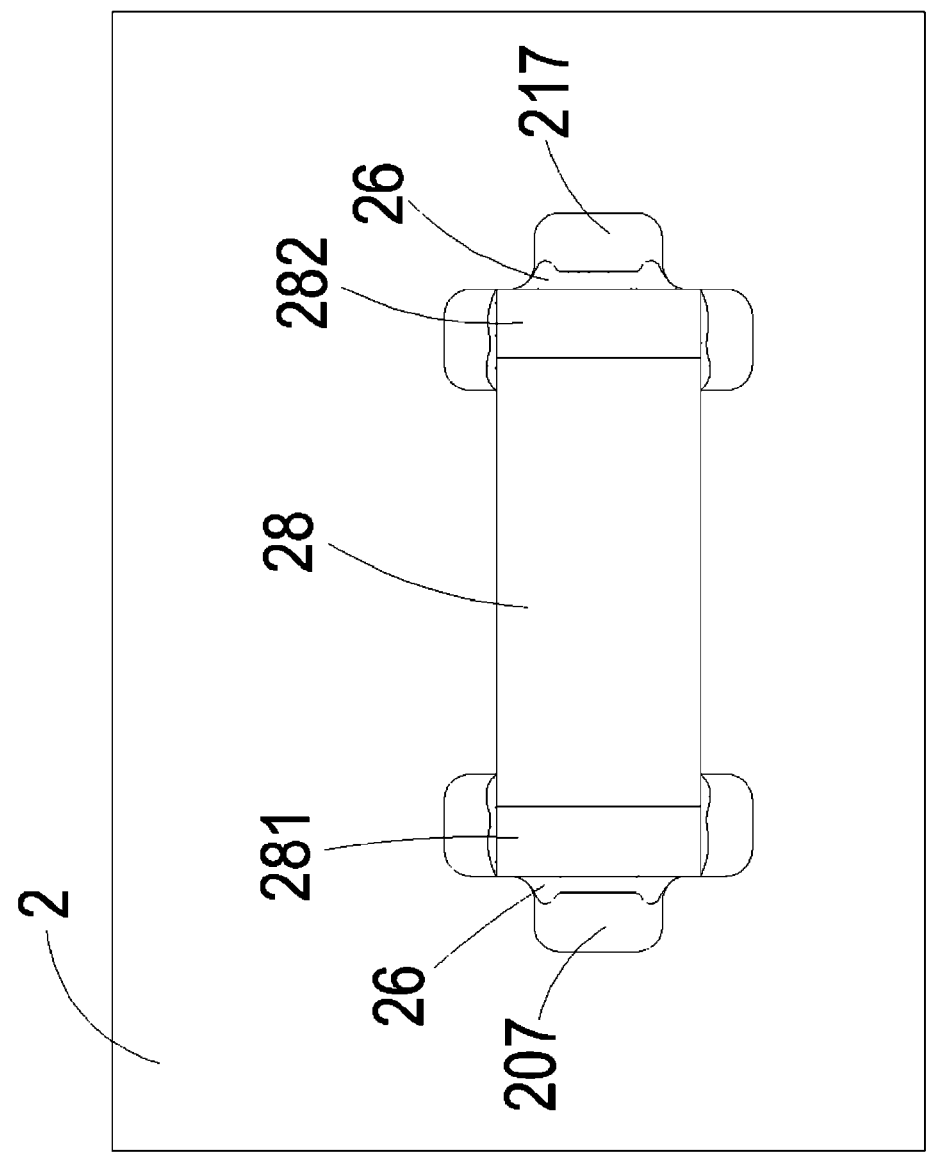
FIG. 5B is a schematic cross-sectional view illustrating a second SMD component mounted on the universal solder pad according to the first embodiment of the present invention.

Please refer to FIG. 5B, which is a schematic cross-sectional view illustrating the second SMD component mounted on the universal solder pad according to the first embodiment of the present invention. As shown in FIG. 5B, the first conductive part 281 and the second conductive part 282 of the second SMD component 28 are attached on the first pad unit 20 and the second pad unit 21 via the solder paste 26. Since the width of the conductive part 281 (282) is greater than the first border 206a (216a) of the first extension portion 206 (216) and the second border 206b (216b) is parallel with the third border 206c (216c), the second borders 206b 216b and the third borders 206c, 216c may function as retaining marks for facilitating alignment of the first conductive part 281 and the second conductive part 282 of the second SMD component 28 with respect to the first pad unit 20 and the second pad unit 21. Moreover, the second sidewall 203 (213) and the third sidewall 204 (214) of the main portion 201 (211) may also function as retaining marks at this circumstance. In addition, the first conductive part 281 and the second conductive part 282 of the second SMD component 28 are mounted on the main portions 201, 211 and partially the confining portions 207, 217. Since the areas of the confining portions 207, 217 are smaller than the main portions 201, 211, the borders of the confining portion 207 and 217 may be naturally formed as a retaining wall for hindering the solder paste from overflowing outside the first pad unit 20 and the second pad unit 21. By means of the universal solder pad of the present invention, the oblique alignment and the tombstone defects are minimized.

Figure 6:
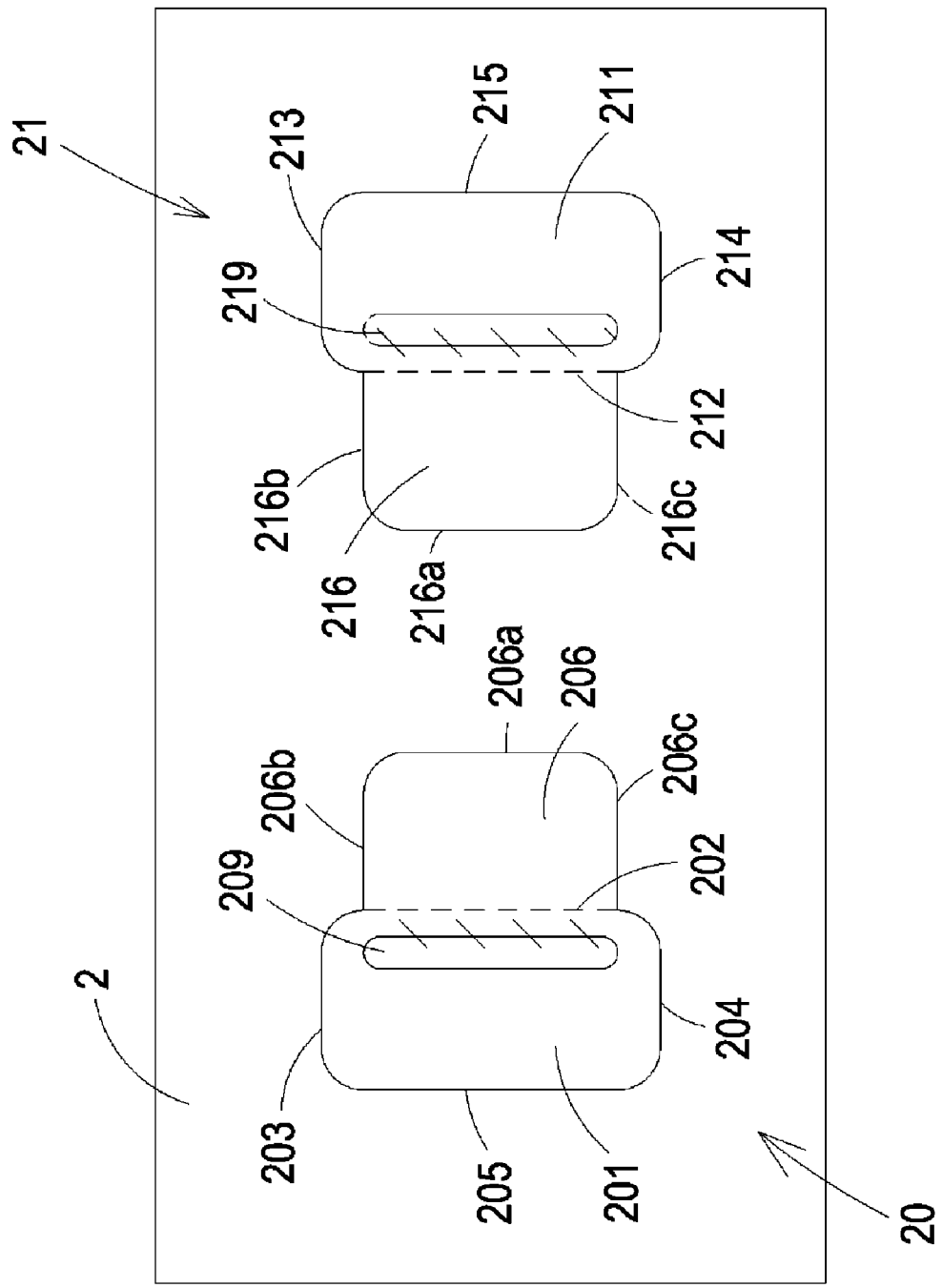
FIG. 6 is a schematic view illustrating a universal solder pad according to a second embodiment of the present invention.

Referring to FIG. 6, a schematic view of a universal solder pad according to a second preferred embodiment of the present invention is illustrated. As shown in FIG. 6, the elements corresponding to those in FIG. 3 will be designated by identical numeral references. In this embodiment, the first extension portions 206 and 216 included therein are similar to those shown in FIG. 3, and are not redundantly described herein. Whereas, the first pad unit 20 and the second pad unit 21 include confining portions 209 and 219, which are formed on the main portions 201 and 211, respectively. In this embodiment, the confining portions 209 and 219 are elongated strips, which are made of non-solderable primer. The confining portions 209 and 219 are substantially parallel with the first borders 206a, 216a of the first extension portions 206, 216 and distant from the first sidewalls 202, 212 of the main portions 201, 211.

Figure 7:
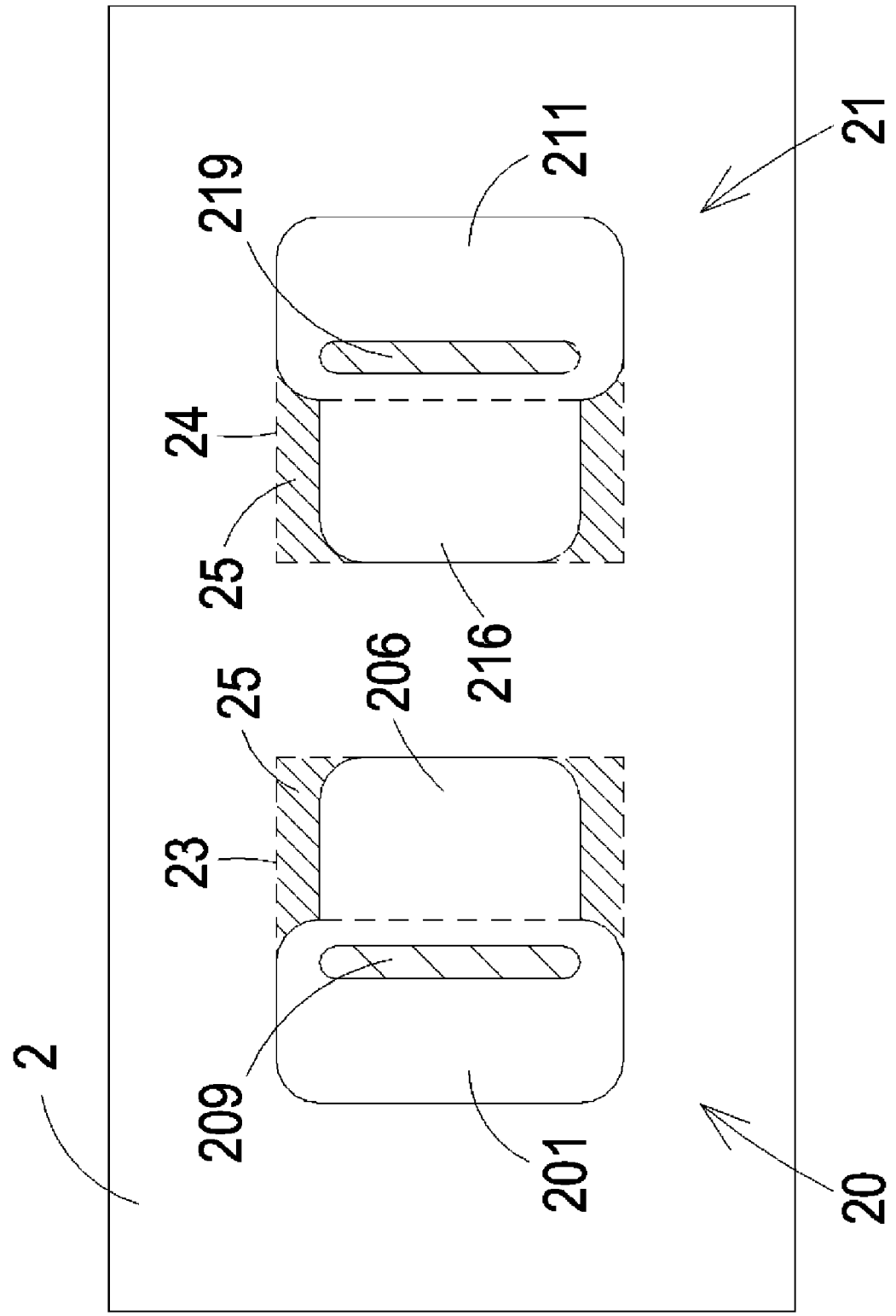
FIG. 7 is a schematic view illustrating a variant of the universal solder pad in FIG. 6.

The profiles of the universal solder pad in FIG. 6 may be formed on the circuit carrier 2 by etching. The confining portions 209 and 219 are applied on the main portions 201, 211 by using a photo mask. It is noted that, however, those skilled in the art will readily observe that numerous modifications and alterations of may be made to fabricate the universal solder pad. For example, as shown in FIG. 7, two rectangular solderable regions 23 and 24 are firstly formed on the circuit carrier 2, and then non-solderable primer 25 is applied on two corners of the rectangular solderable regions 23 and 24 to define the first pad unit 20 and the second pad unit 21. Likewise, the confining portions 209 and 219 are applied on the main portions 201, 211 by using a photo mask.

The universal solder pad of the present invention may be used with different-sized SMD components. Hereinafter, a first SMD component (e.g. a 0805 stack capacitor having a dimension of 0.08"×0.05"), a second SMD component (e.g. a 1206 stack capacitor having a dimension of 0.126"×0.063") and a third SMD component (e.g. a 1210 stack capacitor having a dimension of 0.126"×0.100") are illustrated for example with reference to FIG. 8.

Figure 8A:
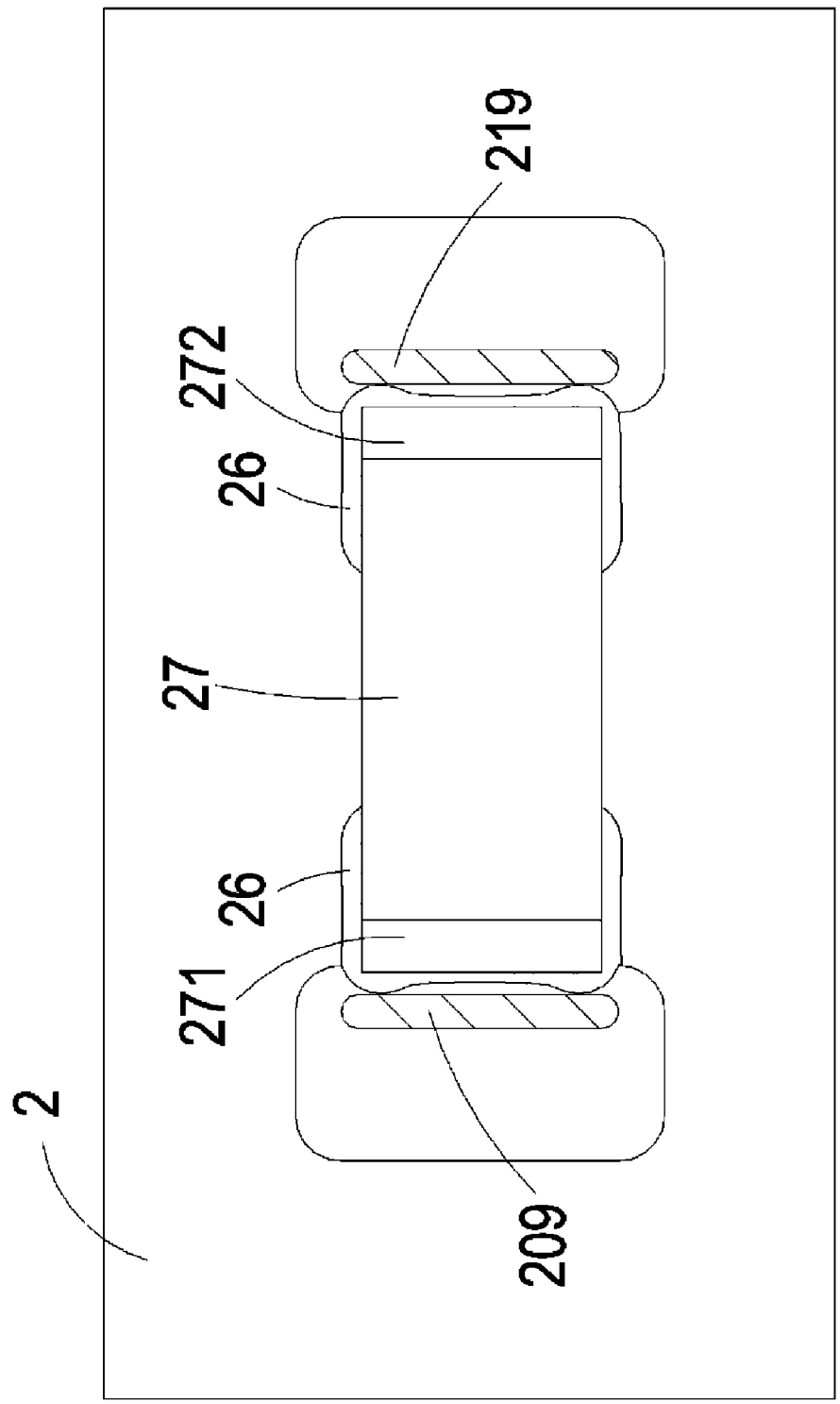
FIG. 8A is a schematic cross-sectional view illustrating a first SMD component mounted on the universal solder pad according to the second embodiment of the present invention.

Please refer to FIG. 8A, which is a schematic cross-sectional view illustrating the first SMD component mounted on the universal solder pad according to the second embodiment of the present invention. As shown in FIG. 8A, the first conductive part 271 and the second conductive part 272 of the first SMD component 27 are attached on the first pad unit 20 and the second pad unit 21 via the solder paste 26. Since the width of the conductive part 271 (272) is smaller than the first border 206a (216a) of the first extension portion 206 (216) and the second border 206b (216b) is parallel with the third border 206c (216c), the second borders 206b 216b and the third borders 206c, 216c may function as retaining marks for facilitating alignment of the first conductive part 271 and the second conductive part 272 of the first SMD component 27 with respect to the first pad unit 20 and the second pad unit 21. As a consequence, the possibility of causing the oblique alignment is reduced. In addition, the second borders 206a, 216a and the third borders 206c, 216c may hinder the solder paste 26 from overflowing outside the first pad unit 20 and the second pad unit 21. Moreover, since the confining portions 209 and 219 are close to the first conductive part 271 and the second conductive part 272 of the first SMD component 27, the confining portions 209 and 219 may function as retaining walls for hindering the solder paste 26 from overflowing outside the first pad unit 20 and the second pad unit 21. By means of the universal solder pad of the present invention, the oblique alignment and the tombstone defects are minimized.

Figure 8B:
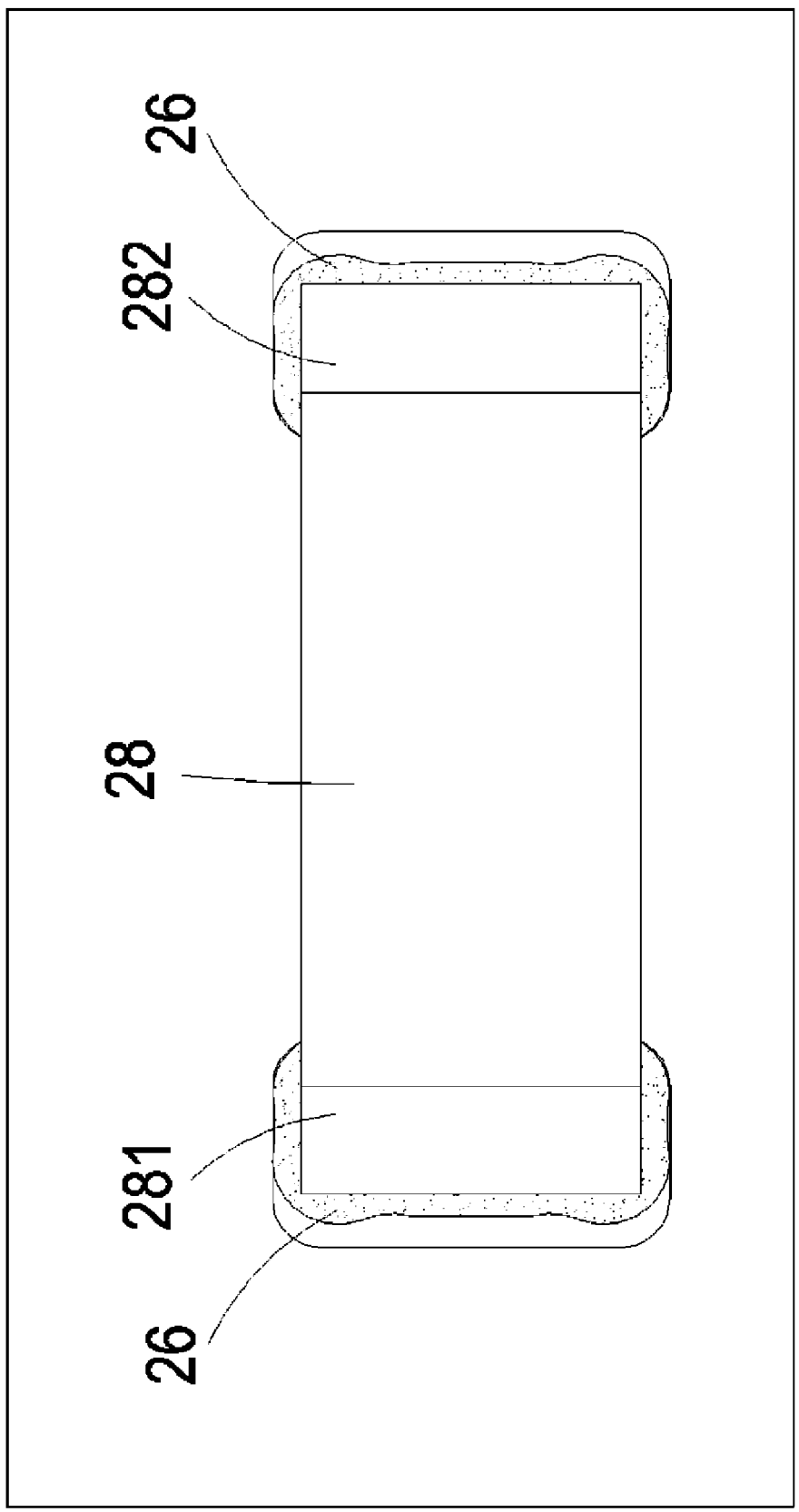
FIG. 8B is a schematic cross-sectional view illustrating a second SMD component mounted on the universal solder pad according to the second embodiment of the present invention.

Please refer to FIG. 8B, which is a schematic cross-sectional view illustrating the second SMD component mounted on the universal solder pad according to the second embodiment of the present invention. As shown in FIG. 8B, the first conductive part 281 and the second conductive part 282 of the second SMD component 28 are attached on the first pad unit 20 and the second pad unit 21 via the solder paste 26. Since the width of the conductive part 281 (282) is greater than the first border 206a (216a) of the first extension portion 206 (216) and the second border 206b (216b) is parallel with the third border 206c (216c), the second borders 206b 216b and the third borders 206c, 216c may function as retaining marks for facilitating alignment of the first conductive part 281 and the second conductive part 282 of the second SMD component 28 with respect to the first pad unit 20 and the second pad unit 21. Moreover, the second sidewall 203 (213) and the third sidewall 204 (214) of the main portion 201 (211) may also function as retaining marks at this circumstance. In addition, since the first conductive part 281 and the second conductive part 282 of the second SMD component 28 are partially or fully cover the confining portions 209, 219, the friction between the conductive part 281 (282) and the confining portion 209 (219) is increased. As a consequence, the deviation of the second SMD component 28 is reduced. Moreover, the borders of the main portions 201, 211 may be naturally formed as a retaining wall for hindering the solder paste 26 from overflowing outside the first pad unit 20 and the second pad unit 21. By means of the universal solder pad of the present invention, the oblique alignment and the tombstone defects are minimized.

Please refer to FIG. 8C, which is a schematic cross-sectional view illustrating the third SMD component mounted on the universal solder pad according to the second embodiment of the present invention. As shown in FIG. 8C, the first conductive part 291 and the second conductive part 292 of the third SMD component 29 are attached on the first pad unit 20 and the second pad unit 21 via the solder paste 26. Since the width of the conductive part 291 (282) is greater than the first border 206a (216a) of the first extension portion 206 (216) and the second border 206b (216b) is parallel with the third border 206c (216c), the second borders 206b 216b and the third borders 206c, 216c may function as retaining marks for facilitating alignment of the first conductive part 291 and the second conductive part 292 of the third SMD component 29 with respect to the first pad unit 20 and the second pad unit 21. Moreover, the second sidewall 203 (213) and the third sidewall 204 (214) of the main portion 201 (211) may also function as retaining marks at this circumstance. In addition, since the first conductive part 291 and the second conductive part 292 of the third SMD component 29 are partially or fully cover the confining portions 209, 219, the friction between the conductive part 281 (282) and the confining portion 209 (219) is increased. As a consequence, the deviation of the third SMD component 29 is reduced. Moreover, the borders of the main portions 201, 211 may be naturally formed as a retaining wall for hindering the solder paste 26 from overflowing outside the first pad unit 20 and the second pad unit 21. By means of the universal solder pad of the present invention, the oblique alignment and the tombstone defects are minimized.

From the above description, it is found that the universal solder pad of the present invention is applicable to different-sized SMD components, thereby enhancing cost-effectiveness. By using the universal solder pad of the present invention, the undesired effects such as oblique alignment, deviation and/or tombstone defects are minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A universal solder pad of a circuit carrier for use with a plurality of SMD components having different sizes, each of said SMD components comprising a first conductive part and a second conductive part, said universal solder pad comprising:
   a first pad unit electrically connected to said first conductive part of said SMD component; and
   a second pad unit electrically connected to said second conductive part of said SMD component,
   wherein each of said first pad unit and said second pad unit includes a main portion and a first extension portion, said first extension portion is extended from a first sidewall of said main portion and includes a first border, a second border and a third border, and said second border and said third border of said first extension portion are parallel with each other for facilitating alignment of said first and second conductive parts of said SMD component with respect to said first pad unit and said second pad unit;
   said main portions of said first pad unit and said second pad unit further include respective second sidewalls, third sidewalls and fourth sidewalls,
   wherein the distance from said second border to said third border is shorter than that from said second sidewall to said third sidewall of the main portion; and
   wherein said first pad unit and said second pad unit further include respective confining portions, which are extended from the middles of said fourth sidewalls of said main portions.

2. The universal solder pad according to claim 1 wherein said first sidewalls of said main portions of said first pad unit and said second pad unit are disposed beside each other.

3. The universal solder pad according to claim 2 wherein said first extension portions of said first pad unit and said second pad unit are extended from the middles of said first sidewalls of said main portions and are symmetrical with each other.

4. The universal solder pad according to claim 2 wherein said confining portions are for confining said SMD component to be deviated from said first pad unit and said second pad unit.

5. The universal solder pad according to claim 4 wherein said confining portions are second extension portions.

6. The universal solder pad according to claim 5 wherein the length of said confining portion is smaller than that of said first extension portion for each of said first pad unit and said second pad unit, and two turning portions are formed between two corners of said confining portion and said main portion for each of said first pad unit and said second pad unit.

7. The universal solder pad according to claim 5 wherein the length and the width of said confining portion are smaller than those of said main portion for each of said first pad unit and said second pad unit.

8. The universal solder pad according to claim 5 wherein the profiles of said first pad unit and said second pad unit are formed on said circuit carrier by etching.

9. The universal solder pad according to claim 5 wherein the profiles of said first pad unit and said second pad unit are formed on said circuit carrier by firstly forming two rectangular solderable regions on said circuit carrier and then applying non-solderable primer on four corners of said rectangular solderable regions, thereby defining said first pad unit and said second pad unit 10. The universal solder pad according to claim 5 wherein said plurality of SMD components includes a first SMD component and a second SMD component.

11. The universal solder pad according to claim 10 wherein said first SMD component is a 0603 stack capacitor and said second SMD component is a 0805 stack capacitor.

12. The universal solder pad according to claim 4 wherein said confining portions are disposed on said main portions of said first pad unit and said second pad unit.

13. The universal solder pad according to claim 12 wherein said confining portions are substantially elongated strips, which are made of non-solderable primer.

14. The universal solder pad according to claim 12 wherein said confining portions are substantially parallel with said first borders of said first extension portions and distant from said first sidewalls of said main portions.

15. The universal solder pad according to claim 12 wherein said confining portions are applied on said main portions by using a photo mask.

16. The universal solder pad according to claim 12 wherein said plurality of SMD components includes a first SMD component, a second SMD component and a thirdSMD component.

17. The universal solder pad according to claim 16 wherein said first SMD component is a 0805 stack capacitor, said second SMD component is a 1206 stack capacitor and said third SMD component is a 1210 stack capacitor.

18. A solder pad of a circuit carrier for use with a SMD component, said SMD components comprising a first conductive part and a second conductive part, said solder pad comprising:

a first pad unit electrically connected to said first conductive part of said SMD component; and a second pad unit electrically connected to said second conductive part of said SMD component, wherein each of said first pad unit and said second pad unit includes a main portion and a first extension portion, said first extension portion is extended from a first sidewall of said main portion and includes a first border, a second border and a third border, and said second border and said third border of said first extension portion are parallel with each other for facilitating alignment of said first and second conductive parts of said SMD component with respect to said first pad unit and said second pad unit;

said main portions of said first pad unit and said second pad unit further include respective second sidewalls, third sidewalls and fourth sidewalls, wherein the distance from said second border to said third border is shorter than that from said second sidewall to said third sidewall of said main portion, and wherein said first pad unit and said second pad unit further include respective confining portions, which are extended from the middles of said fourth sidewalls of said main portions.

* * * * *